(12) United States Patent
Stipp et al.

(10) Patent No.: US 6,786,391 B2
(45) Date of Patent: Sep. 7, 2004

(54) METHOD OF CONTROLLING SOLDER DEPOSITION UTILIZING TWO FLUXES AND PREFORM

(75) Inventors: John N. Stipp, Alsip, IL (US); Brian T. Deram, Lincolnshire, IL (US)

(73) Assignee: KAC Holdings, Inc., Des Plaines, IL (US)

(*) Notice: Subject to any disclaimer, the term of this patent is extended or adjusted under 35 U.S.C. 154(b) by 0 days.

(21) Appl. No.: 10/271,883

(22) Filed: Oct. 16, 2002

(65) Prior Publication Data

US 2004/0074952 A1 Apr. 22, 2004

(51) Int. Cl.⁷ .................. B23K 31/02; B23K 35/12; B23K 28/00

(52) U.S. Cl. .................. 228/180.22; 228/201; 228/207; 228/208; 228/245; 228/246

(58) Field of Search ................ 228/245, 207, 228/208, 214, 223, 246, 180.22, 201; 174/260; 257/734, 737, 738

(56) References Cited

U.S. PATENT DOCUMENTS

| | | | |
|---|---|---|---|
| 3,855,679 A | * 12/1974 | Schmatz | 428/643 |
| 4,504,007 A | * 3/1985 | Anderson et al. | 228/123.1 |
| 5,269,453 A | * 12/1993 | Melton et al. | 228/180.22 |
| 5,371,404 A | 12/1994 | Juskey et al. | |
| 5,543,585 A | 8/1996 | Booth et al. | |
| 5,641,996 A | 6/1997 | Omoya et al. | |
| 5,729,440 A | 3/1998 | Jimarez et al. | |
| 5,985,043 A | 11/1999 | Zhou et al. | |
| 6,017,634 A | 1/2000 | Capote et al. | |
| 6,139,336 A | * 10/2000 | Olson | 439/83 |
| 6,172,141 B1 | 1/2001 | Wong et al. | |
| 6,180,187 B1 | 1/2001 | Ma et al. | |
| 6,220,501 B1 | * 4/2001 | Tadauchi et al. | 228/208 |
| 6,333,469 B1 | * 12/2001 | Inoue et al. | 174/260 |
| 6,367,150 B1 | 4/2002 | Kirsten | |
| 6,590,287 B2 | * 7/2003 | Ohuchi | 257/738 |
| 2001/0026010 A1 | * 10/2001 | Horiuchi et al. | 257/678 |
| 2001/0042778 A1 | * 11/2001 | Tanaka | 228/207 |
| 2002/0104682 A1 | * 8/2002 | Park et al. | 174/255 |
| 2004/0026484 A1 | * 2/2004 | Yamashita et al. | 228/180.22 |

FOREIGN PATENT DOCUMENTS

DE 2355501 A1 * 5/1975

* cited by examiner

Primary Examiner—L. Edmondson
(74) Attorney, Agent, or Firm—W. Dennis Drehkoff; Ladas & Parry

(57) ABSTRACT

Method for controlling the deposition of solder on a base metal or substrate is disclosed. The method comprises applying an attaching flux and finishing flux to a substrate, placing a preform thereon and subjecting the same to reflow conditions. The finishing flux is applied to solubilize the normally insoluble corrosive residues that would occur when the attaching flux is subjected to reflow conditions with the preform and substrate. Alternatively, the attaching flux may be applied to the preform and substrate before undergoing reverse reflow conditions and then the finishing flux is applied to the solder deposit and substrate and the same subjected to second reflow conditions. After each method, the residues left from the attaching flux which are solubilized by the finishing flux, are cleaned by washing with a typical solvent.

60 Claims, 3 Drawing Sheets

*Fig. 3*
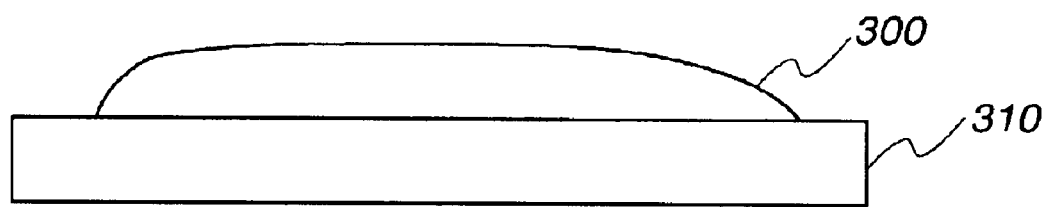
*Fig. 4A* *Fig. 4B*
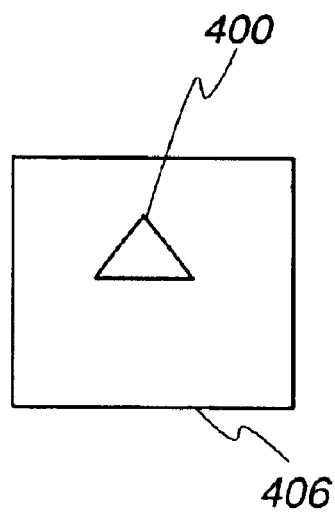 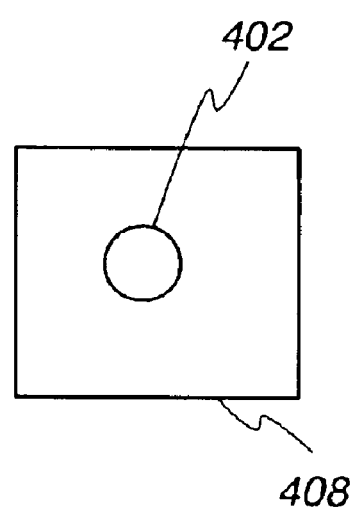

METHOD OF CONTROLLING SOLDER DEPOSITION UTILIZING TWO FLUXES AND PREFORM

BACKGROUND OF THE INVENTION

1. Field of the Invention

The present invention relates to a method of controlling solder deposition on a base metal, and in particular, to a method comprising the use of two distinct fluxes to bond a solder to a base metal or substrate and facilitate the removal of residues.

2. Description of the Prior Art

When soldering to a metal surface, whether the purpose for soldering is to create electrical connections or non-electrical, mechanical connections, the solder must metalize, or bond to, the metal surface. Good electrical or thermal conduction by the solder is dependent on void-free solder bonding to the metal surface. An example in the electronics assembly industry is to solder a metallic lid or cover onto an electronic device that must be cooled. The heat conducting lid can then radiate heat or transfer it to a thermal pipe for removing the heat, thereby cooling the device. The soldering flux must be selected for its ability to remove contamination, mostly oxides, from the metal surface so the melted solder can properly bond to the metal.

The vast number of soldering fluxes can be placed into groupings or categories by the corrosive nature of their residues as is done in IPC/EIA Standard J-STD-004 "Requirements for Soldering Fluxes". This industry document classifies fluxes according to their basic composition and percent halides included in the composition. Another industry standard is ASTM B 32 "Standard Specification for Solder Metals" that includes a similar grouping of flux types. Additionally, another international standard is ISO 9454 "Soft Soldering Fluxes—Classification and Requirements" that delineates the performance requirements for fluxes classified by ingredients. There may be flux choices not specifically covered by these standards, but generally the fluxes can be categorized by composition into three groups and defined as:

Inorganic Flux—A solution of inorganic acids and/or salts, including, but not limited to, halide salts of metals, such as zinc chloride, zinc bromide, stannous chloride, stannous bromide, stannous fluoride, sodium chloride, in water and optionally containing ammonium chloride, mineral acids, such as hydrochloric acid, hydrobromic acid, phosphoric acid.

Organic Flux—Primarily composed of organic materials other than rosin or resin, including, but not limited to, water soluble carboxylic acids, such as formic acid, acetic acid, propionic acid, malonic acid, glycolic acid, lactic acid, glyceric acid, malic acid, tartaric acid, and citric acid; water insoluble carboxylic acids, such as stearic acid, oleic acid, benzoic acid, salicylic acid, succinic acid, adipic acid, azelaic acid; optionally containing in admixture amines, amides, and hydrohalide derivatives of the amines and acids.

Rosin Flux—Primarily composed of natural resins extracted from the oleoresin of pine trees and refined, the composition may also contain additives to increase activity, such as other organic acids and amine hydrohalides. Rosin fluxes are generally not water soluble.

Additionally, the flux compositions may vary in activity as indicated by the level of halides included in the flux and by corrosion testing. Inorganic and Organic fluxes are generally water-soluble, while rosin fluxes are solvent-soluble. It is not the intention of the present invention to specify a flux type or composition, but rather to demonstrate the potential use of the variety of available fluxes.

High activity fluxes, in particular the Inorganic and Organic water-soluble types, are very effective for soldering even the most difficult metals, but may cause the formation of harmful, insoluble, corrosive residues on the soldered assembly. If allowed to remain on the substrate, the residues can result in electrical or mechanical failure of the product. In order to use a high activity flux, the present invention utilizes a second flux to render the residues from the high activity flux soluble in water, or other suitable solvent, so they can be removed from the product by washing. The second flux is a finishing flux that may or may not contain halides or other corrosive materials. If the finishing flux contains corrosives and/or halides, they must be cleanable after the reflow process. These fluxes are used in the method of the present invention with a preform of any solderable composition because they allow for versatility in depositing solder of any size or shape to the substrate.

Prior art processes to reduce the amount of residue formed on the metal after applying a deposition of solder on a base metal include using a less active flux, which can result in poor solder joints, dewetting or incomplete soldering. Another method utilizes a resist material to define the area of deposit on the metal substrate. The flux is applied and placed in the area bounded by the resist and, and then the metal substrate is dipped in molten solder or passed across a wave of solder. This method is undesirable because of the potential heat damage on the substrate and irregular solder deposit. Further, another prior art method utilizes a solder-mask in an attempt to limit the spread of the solder deposit when solder paste is applied in the area defined by the soldermask. Though the solder deposit can be more uniform. The use of a soldermask would generally be expensive, time-consuming and inefficient.

The present invention utilizes two different fluxes for bonding preformed solder onto a base metal wherein the base metal or substrate, preform and flux may be subjected to reflow conditions one or two times.

SUMMARY OF THE INVENTION

The present invention is generally directed to methods of controlling solder deposition on a base metal or substrate using conductive connections; the connections may be for applications involving the passage of electrical or thermal energy. The methods may be utilized with electrical connections and non-electrical connections, i.e., transporting thermal energy from the device via heat sinks. The methods may also be used in forming connections for the transporting of electrical energy from one conductive metal to another metal. The first method comprises applying a sufficient amount of an attaching flux to a base metal or substrate, placing a preform on the flux on the substrate, applying a sufficient amount of finishing flux onto the preform, subjecting the substrate, fluxes, and preform to reflow conditions, cooling, cleaning the substrate and preform, now the solder deposit, and drying the substrate and solder deposit. An alternate method of the present invention comprises applying the attaching flux to a base metal or substrate, placing a preform on the flux on the substrate, subjecting the substrate, attaching flux, and preform to reflow conditions, then applying a finishing flux to the substrate and preform, now the solder deposit, subjecting the substrate, solder deposit, and finishing flux to reflow conditions, cooling, cleaning the substrate and solder deposit, and drying.

It is the object of the present invention to provide a method of controlling solder deposition on a base metal.

It is another object of the present invention to provide a method of controlling solder deposition on a base metal used in a conductive connection.

It is an object of the present invention to provide a method of controlling solder deposition on a base metal wherein the base metal is used for the passage of electrical or thermal energy.

It is an object of the present invention to provide a method of controlling solder deposition on a base metal that forms a bond with a heat sink, electrical connection or non-electrical connection.

It is an object of the present invention to use an aggressive attaching flux and a compatible finishing flux to provide a reliable bond when soldering metals to substrates.

It is an object of the present invention to provide a method of using an aggressive flux with a solder without regard to the formation of harmful, insoluble, corrosive residues.

Other features and advantages of the present invention will become apparent to one skilled in the art upon examination of the following drawings and detailed description. It is intended that all such additional features and advantages be included herein given the scope of the present invention, as defined by the claims.

BRIEF DESCRIPTION OF THE DRAWINGS

FIG. 3 shows a side elevation of the deposition of solder on a substrate, and

FIGS. 4a and 4b show the deposition of preforms on a metal substrate.

DETAILED DESCRIPTION

Figure 1:
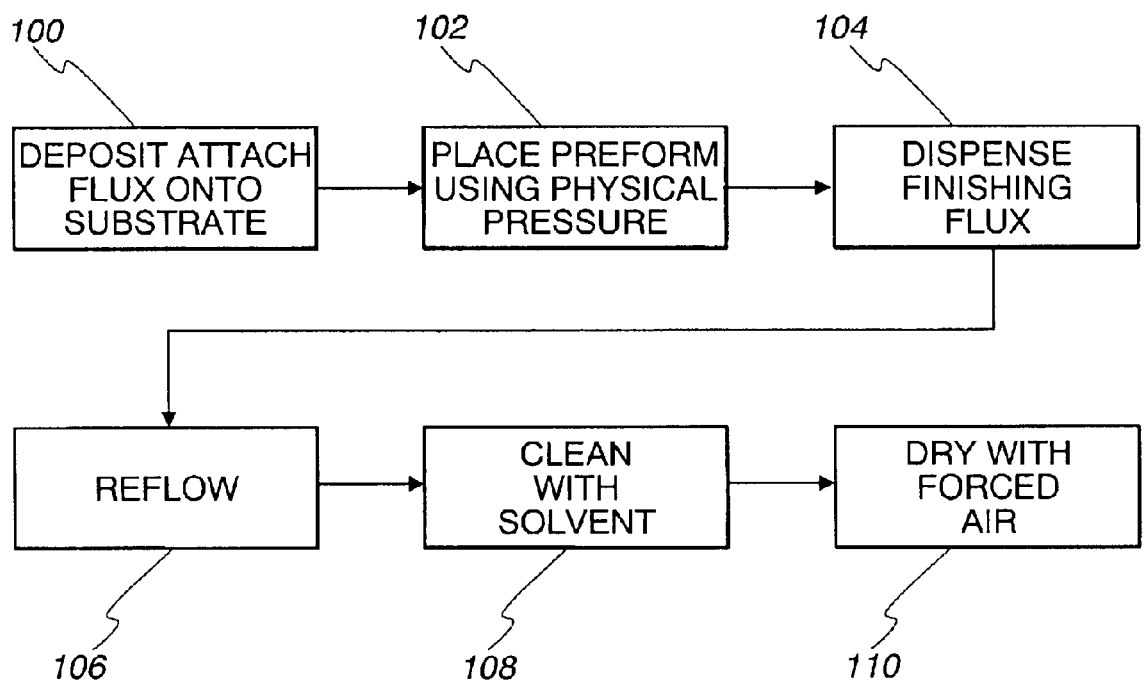
FIG. 1 is a flow chart of the single reflow process of the present invention.

In accordance with the present invention, the following terms are used herein for the description of the invention.

Substrate or base metal is the metal surface being soldered or the metal material on which a meltable preform may be attached by melting the preform. The substrate, for example, may be copper, nickel, brass, gold, or stainless steel. The substrate may also be a metal or ceramic material that is plated with a solderable metal, such as copper, nickel, gold over nickel, tin-nickel, silver, or palladium.

Attaching flux is a material of sufficient activity to remove oxides and promote solder bonding on the substrate metal. The attaching flux materials may be solid, liquid, viscous paste, or tacky. The attaching flux may be mild or aggressive, depending on the tenacity of the oxidation or tarnish on the substrate surface. Aggressive attaching fluxes used for the solder bonding process could leave salt residue that is insoluble in water and most solvents. The amount and nature of the residue depends upon the chemical composition of the flux, the metal substrate, and the preform alloy used in the particular application.

A finishing flux is chosen by its compatibility with the attaching flux. A finishing flux solubilizes residues and salts from an attaching flux and allows the residues to be washed away with an appropriate solvent. The finishing flux leaves no corrosive residue or insoluble salt after washing. The finishing flux preferably will be of a viscous nature, must have sufficient activity to solubilize salts of inorganic and organic acids, but not active enough to promote additional solder spreading on the base metal or substrate.

Preform is a pre-controlled amount of solder in a defined shape or matched to a dimension of the final desired solder deposit.

Solvent is any suitable liquid that will dissolve and wash away the finishing flux from the surface of the substrate and solder deposit after reflow of the preform. The solvent will be specific to the preform, flux, and substrate used. For example, the solvent may be any polar or non-polar solvent, water, alcohol, terpenes, aliphatic or aromatic petroleum hydrocarbon solvents, esters, ketones, glycol ethers, halogenated hydrocarbons, amines, etc.

Reflow is the act of heating the substrate and preform to a temperature that is greater than the liquidus of the preform. In the reflow process, preheating may be employed to evaporate the volatile solvents in the flux prior to the preform melting. The wetting ability of the flux is directly related to the peak reflow temperature. The temperature must be high enough to allow good wetting by the solder preform, but not so high as to cause excessive degradation of the flux. The reflow heat is accomplished by a combination of temperature and dwell time. The heat directly affects the activity of the flux and thus the solderability. The preheating and peak temperature and time duration are parameters to be monitored.

The method of the present invention is advantageous because it allows for a controlled deposition of solder utilizing an aggressive flux, if necessary, to assure a strong attachment of the preform to the substrate. Benefits of using a controlled amount of an aggressive flux include complete solder wetting of the substrate and elimination of voids between the solder and substrate. Voids are detrimental particularly in heat transfer assemblies because entrapped air and gases act as insulators, thus reducing the efficiency of heat transfer. The method uses a highly aggressive flux with no concern about a corrosive residue because the residue can be effectively removed by the application of the finishing flux and washing. The method of the present invention allows for soldering metals that are difficult to solder with mild, non-corrosive fluxes, by using an aggressive flux, followed by a finishing flux to solubilize the residues for washing away. A controlled amount or sufficient or effective amount is the amount of attaching flux that will fill the capillary space between the preform and substrate. If too much attaching flux is used, it will be forced out of the edges of the preform covering the flux on the substrate when the preform is placed thereon. Preferably a small amount of pressure is used to place the preform on the flux on the substrate. If too much pressure is used, some of the flux will be displaced from under the preform.

Solders used in the method of the present invention are conventional, for example, without being unduly limitative they may be tin-lead alloys, tin-silver alloys, tin-copper alloys, tin-silver-copper alloys, and 100% indium without or with tin additions. Typical amounts of metals in the alloys are as follows: (Sn 63% Pb 37%), (Sn 50% Pb 50%), (Sn 60% Pb 40%), (Sn 95% Ag 5%), (Sn 96.5%% Ag 3.5%), In 100%, (In 95.5% Sn 0.5%), (In 99.75% Sn 0.25%). The method of the present invention will function with essentially any solder that is compatible with the flux and metal substrate.

Relating to substrates, which can be any solderable metal or plating, some are easier to solder to than others. The substrate may be plated with a second metal to prevent corrosion such as nickel plated on copper, or to improve solderability such as palladium plated on nickel or nickel plated on aluminum. The following Table I shows a listing of substrates or platings in Groups 1–4 wherein the difficulty to solder increases as the number of the Group increases:

TABLE I

| Group | Substrates or Platings |
|---|---|
| 1 | platinum, gold, copper, tin, solder, palladium, silver |
| 2 | nickel, cadmium, brass, lead, bronze, rhodium, beryllium-copper |
| 3 | nickel-iron alloy, nickel-iron-cobalt alloy |
| 4 | zinc, mild steel, stainless steel, nickel-chrome alloy, nickel-copper alloy, aluminum |

The ease of soldering is due to the nature of the oxidation on the metal surface. Oxides on Group 1 metals can be removed with mild fluxes, such as rosin fluxes and many organic fluxes. However, metals in Group 4 have tenacious oxides that require more aggressive fluxes such as the inorganic type. The methods of the present invention can be utilized with all the foregoing metal substrates. Nevertheless, often an easier to solder second metal may be plated on a metal surface that is more difficult to solder, for example, nickel plating on steel, gold plating on nickel, palladium plating on nickel, nickel plating on aluminum.

The following Table II shows typical attaching fluxes used in the process of the present invention on three metal substrates that are increasingly difficult to solder. The three metal substrates are representative of the groups of substrates in Table I. In Table II, the column "Fluxes" shows increased activity of the attaching fluxes listed from top to bottom, therefore, the IA or Inorganic Acid Flux has more activity and is more corrosive than type RMA or type RA rosin fluxes. The designation of fluxes is conventional and known in the industry.

TABLE II

| Fluxes | Type | Copper | Nickel | Stainless Steel |
|---|---|---|---|---|
| Rosin, mildly activated | RMA | X | | |
| Rosin, highly activated | RA | X | X | |
| Organic acid | OA | X | X | |
| Inorganic acid | IA | X | X | X |

In Table II, "X" denotes the flux will cause the melted solder to wet the base metal or substrate. Every flux type can be used with the metal substrate copper. Some more active, more aggressive, fluxes can be used on copper and nickel. The most aggressive fluxes are required for soldering stainless steel. While all fluxes identified in Table II can be used for the present invention, the most aggressive are preferred as attaching fluxes, specifically the last three in the column under "Fluxes", Rosin highly activated (RA), organic acid (OA), and inorganic acid (IA). Some attaching fluxes, for example rosin mildly activated (RMA), may not be sufficiently active to adequately accomplish the soldering or bonding of the solder to the substrate. If this occurs, a finishing flux can be applied on top of the preform, attaching flux and substrate and the steps of the single reflow process are followed. The addition of the finishing flux provides for thermal insulation of the attaching flux which allows for reduction in the rate of temperature increase during reflow heating. This improves the heat stability of the attaching flux.

The foregoing fluxes may also be used as finishing fluxes, including rosin types (R), not listed above, as long as they are compatible and soluble with the specific attaching flux. Compatibility is primarily related to solubility. If the fluxes are soluble in the same solvents, they are considered compatible.

For the purpose of removing the flux residues after reflow heating of the finishing flux, the cleaning solvent may be a polar or non-polar liquid. Polar solvents include alcohols and preferable water. Non-polar solvents include, but are not limited to, aliphatic or aromatic petroleum hydrocarbon solvents, esters, ketones, glycol ethers, halogenated hydrocarbons, amines and mixtures thereof.

Representative flux formulations appear in Table III. The formulations are examples intended to enable those skilled in the art of soldering fluxes to apply the principles of this invention in practical embodiments, but are not intended to limit the scope of the invention.

TABLE III

| Flux | Type | Weight % | Chemical Name | Solubility |
|---|---|---|---|---|
| Attaching Flux A | RMA | 35 | Rosin | Non-Polar |
| | | 0.1 | Diethylamine hydrochloride | |
| | | 64.9 | 2-propanol | |
| Attaching Flux B | RA | 25 | Rosin | Non-Polar |
| | | 1 | Diethylamine Hydrochloride | |
| | | 74 | 2-propanol | |
| Attaching Flux C | OA | 11 | Glutamic Acid Hydrochloride | Polar |
| | | 6 | Urea | |
| | | 82 | Water | |
| | | 1 | Ethoxylated Octylphenol | |
| Attaching Flux D | OA | 15 | Glycerine | Polar |
| | | 3 | Hydroxyacetic Acid (70%) | |
| | | 3 | Malic Acid | |
| | | 5 | Dimethylamine Hydrochloride | |
| | | 74 | 2-propanol | |
| Attaching Flux E | OA | 15 | Hydrobromic Acid (48%) | Polar |
| | | 9 | Ethanolamine | |
| | | 74 | Water | |
| | | 2 | Ethoxylated Nonylphenol | |
| Attaching Flux F | IA | 30 | Zinc Chloride | Polar |
| | | 5 | Ammonium Chloride | |
| | | 25 | Hydrochloric Acid (31%) | |
| | | 40 | Water | |
| Attaching Flux G | IA | 30 | Stannous Chloride | Polar |
| | | 10 | Zinc Chloride | |
| | | 10 | Hydrochloric Acid (31%) | |
| | | 50 | Water | |
| Attaching Flux H | IA | 40 | | |
| | | 60 | Orthophosphoric Acid (85%) | Polar |
| | | 39 | Water | |
| | | 1 | Ethoxylated Octylphenol | |
| Finishing Flux 1 | R | 30 | Rosin | Non-Polar |
| | | 20 | Stearic Acid | |
| | | 40 | Petrolatum | |
| | | 10 | Benzoic Acid | |
| Finishing Flux 2 | RMA | 35 | Rosin | Non-Polar |
| | | 61 | Polypropylene Glycol (m.w. 2000) | |
| | | 3 | Turpentine | |
| | | 1 | Styrene Dibromide | |

TABLE III-continued

| Flux | Type | Weight % | Chemical Name | Solubility |
|---|---|---|---|---|
| Finishing Flux 3 | RMA | 25 | Rosin | Polar |
| | | 4 | Hydrogenated Castor Oil | |
| | | 24 | Ethylene Glycol | |
| | | 3 | Malic Acid | |
| | | 39 | Ethoxylated Stearyl Alcohol | |
| | | 3 | Triethanolamine Hydrochloride | |
| | | 2 | Isopropanol Amine | |
| Finishing Flux 4 | RA | 40 | Rosin | Non-Polar |
| | | 40 | Tetrahydrofurfuryl Alcohol | |
| | | 19 | 2-phenoxyethanol | |
| | | 1 | Diethylamine Hydrochloride | |
| Finishing Flux 5 | OA | 45 | Ethylene Glycol | Polar |
| | | 32 | Polyethylene Glycol (m.w. 3350) | |
| | | 20 | Citric Acid | |
| | | 2 | Dimethylamine Hydrochloride | |
| | | 1 | Ethoxylated Octylphenol | |
| Finishing Flux 6 | OA | 7 | Ammonium Chloride | Polar |
| | | 3 | Hydroxyacetic Acid | |
| | | 12 | Polyethylene Glycol (m.w. 3350) | |
| | | 5 | Ethoxylated Octyphenol | |
| | | 68 | Glycerine | |
| | | 5 | Behenamide | |
| Finishing Flux 7 | OA | 1 | Ammonium Bromide | Polar |
| | | 1 | Urea | |
| | | 20 | Ethoxlated Nonylphenol | |
| | | 78 | Ethanol | |
| Finishing Flux 8 | OA | 2 | Ammonium Bromide | Polar |
| | | 1 | Urea | |
| | | 25 | Ethoxylated Stearyl Alcohol | |
| | | 72 | Hexylene Glycol | |
| Finishing Flux 9 | IA | 30 | Orthophosphoric Acid (85%) | Polar |
| | | 40 | Ethoxylated Octylphenol | |
| | | 30 | Water | |
| Finishing Flux 10 | IA | 9 | Zinc Chloride | Polar |
| | | 1 | Ammonium Chloride | |
| | | 6 | Water | |
| | | 57 | Glycerine | |
| | | 18 | Polyethylene Glycol (m.w. 3350) | |
| | | 5 | Ethoxylated Octylphenol | |
| | | 4 | Stearamide | |

To facilitate understanding in the present invention, reference is made to FIG. 1 showing Method 1, the Single Reflow Process. A deposit of a high-activity flux or attach flux, for example, an inorganic acid flux (IA), is placed on the substrate. There are various methods for placing the flux on the substrate 100. The flux may be sprayed on the substrate in a controlled area and thickness, or may be coated or sprayed on the preform prior to placing the preform on the substrate metal, or a controlled deposit of the flux in a quantity sufficient to fill the capillary space between the preform and substrate may be applied. Preferably, pressure may be applied on the preform 102 as it is placed on the substrate to be soldered. If a controlled amount of the flux is deposited, there will be no excess flux on the preform or substrate, therefore none will have to be removed. If excess flux is present, it may be readily blotted or wiped clean. Typically, a small amount of the attaching flux will wet the substrate, indicating the amount of flux is sufficient.

A finishing flux is then added in a controlled amount 104. In determining what is a controlled deposit, the amount is dependent on the activity and consistency of the flux. The sufficient or effective amount of the finishing flux in this process is an amount that will not flow underneath the preform and dilute the attaching flux. For example, the finishing fluxes, as shown in Table II as type RMA or Rosin Mildly Activated fluxes, may not be active enough to function as attaching fluxes and promote solder wetting on the substrate metal being used, but still may have sufficient activity to solubilize the residual salts of the inorganic acid, type IA, flux being used as the aggressive attaching flux. The physical form of the finishing fluxes may be paste or a viscous gel or a liquid. The viscosity characteristics of the fluxes are unique to the flux.

The reflow process 106 allows heating by various methods known in the art: induction heating, infrared, convection oven, hot gas heating, conduction, microwave energy, etc. The temperature of the substrate being soldered is raised typically to about 20° C. to about 40° C. above the liquidus of the solder preform composition. The heating and reflow may take place in an ambient air atmosphere or under nitrogen or other inert atmosphere. The temperature and rate of heating depends upon the mass of the metal substrate and selected attaching flux. Conventional practices suggest that mild attaching fluxes such as rosin, mildly activated, are more susceptible to deterioration by high temperature and slow rate of heating. Therefore, the temperature and rate of heating should be adjusted for the selected flux type as known by skilled workers in the art. Cooling commences when the preform reaches liquidus and metal is wetted.

Next, the solder deposition and substrate are cleaned with a solvent 108, wherein the solvent may be a polar or non-polar liquid, including but not limited to isopropanol, other alcohols, water, aliphatic or aromatic petroleum hydrocarbon solvents, esters, ketones, glycol ethers, halogenated hydrocarbons, amines, and mixtures thereof. Afterwards, the finished assembly is dried 110.

Figure 2:
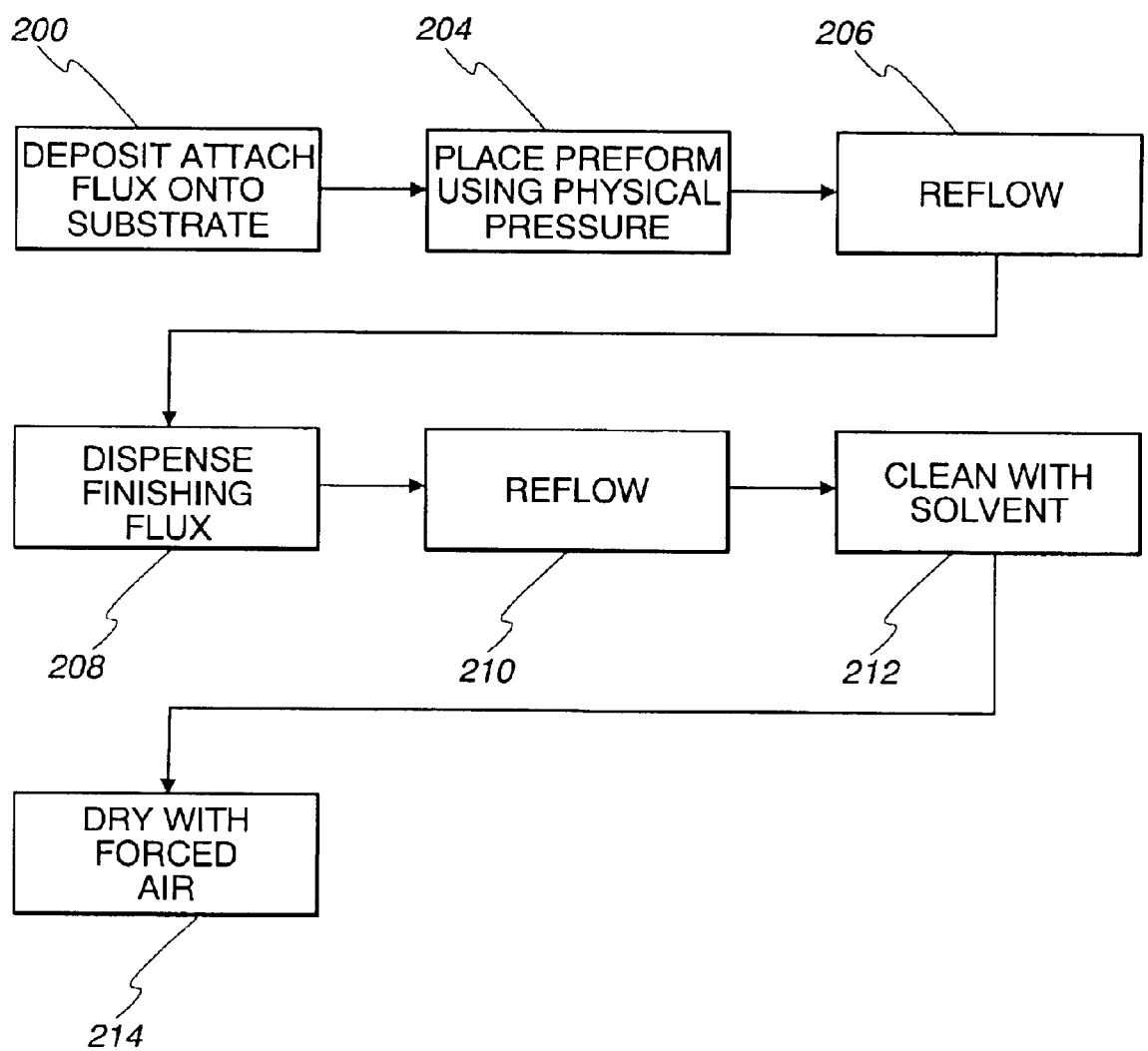
FIG. 2 is a flow chart of the double reflow process of the present invention.

FIG. 2 shows Method 2, a Two Reflow Process. The attaching flux is deposited or placed on the substrate 200 as previously described and the preform is placed on the substrate 204. Reflow 206 then occurs under conditions previously described, but dependent on the flux, metal substrate and preform being used. After the soldering reflow, the finishing flux 208 is applied over the former preform which is now a solder deposit, and reflow 210 takes place again under conditions previously described. The amount of finishing flux is an amount that will cover the attaching flux and at least the edges of the solder deposit. The solder deposit and substrate are then cleaned with a polar or non-polar solvent as previously described and dried 214.

Method I of the present invention provides an effective amount of attaching flux, which is limited to the capillary space between the substrate and preform so that even an aggressive flux can be applied and utilized in a controlled manner to provide a secure bond without concern about harmful residues. In bonding solder to metal, the method of the present invention allows for a substantial deposition of flux and solder so that the solder can be fused to provide an intermetallic bond with the base metal. The present invention allows for a controlled deposition of solder in the area. The solder may be present in amounts ranging from a thickness of about 0.005 inch to about 0.012 inch preferably, and up to 0.200 inch. The deposition of a typical amount of solder may fill an area on the base metal approximately in uniform dimensions without spreading beyond the area of deposition. After reflow on a substrate having dimensions of 1.5 inches by 1.5 inches the solder deposition after reflow would be present in an area of about 0.5 inch by 0.5 inch by 0.012 inch in a dome shape with defined boundaries.

FIG. 3 is a representation of a sufficient amount of solder 300 bonded or deposited on a base metal 310 after reflow. The solder is mounded and retains its position on the metal substrate.

FIGS. 4a and 4b show the deposition of solder 400 and 402 on the base metal 406 and 408 after reflow of various shapes due to the initial shape of the preform. The method of the present invention provides a void-free bond between the solder and the metal substrate.

The following non-limiting examples are presented to further illustrate the present invention. Variations include choice of substrates, solder preform composition, attaching and finishing fluxes, reflow oven speeds, and methods for applying the fluxes. The heating method for melting the solder preform was to use a Sikama conveyorized reflow oven with the reflow zones set as follows: zone 1: 100° C., zone 2: 280° C., zone 3: 100° C., zone 4: off, zone 5: off. Each zone measures 6.25 inches in length and width, and the belt speed was varied to provide the heat required for the solder preform composition. A summary of the results is shown in Table IV.

blotting with a paper-towel. The Finishing Flux 5, as described in Table III, was added to the top of the preform, and around the sides of the preform with an Asymtek Century Series automatic dispensing system. The resulting assembly was then passed through the Sikama oven, previously described, at 60 inches/minute. After reflow, the sample was rinsed with water, then isopropanol, and then dried with forced air. The resulting product was shiny and visually free of any residues.

EXAMPLE 2

A droplet of Attaching Flux F, as described in Table III, of sufficient quantity to wet the surface of the solder preform, was added to a brass substrate. A solder preform of 100% indium with dimensions of 0.5 inch×0.5 inch×0.012 inch was then placed onto the flux. The resulting assembly was then passed through the Sikama reflow oven, previously described, at 60 inches/minute. The Finishing Flux 5, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

TABLE IV

| Example | Surface | Solder | Dimensions (inches) | Conveyor Speed Zone 1 100° C. Zone 2 280° C. Zone 3 100° C. Zones 4 & 5 off | Attach Flux | Finish Flux | Steps |
|---|---|---|---|---|---|---|---|
| 1 | Au on Ni on Cu | In100 | 0.5 × 0.5 × 0.012 | 60 in/min | F | 5 | 1 |
| 2 | Brass | In100 | 0.5 × 0.5 × 0.012 | 60 in/min | F | 5 | 2 |
| 3 | Brass | Sn0.5/In99.5 | 0.5 × 0.5 × 0.012 | 50 in/min | B | 2 | 2 |
| 4 | Cu | In100 | 0.5 × 0.5 × 0.012 | 60 in/min | A | 1 | 1 |
|   | Cu | In100 | 0.5 × 0.5 × 0.012 | 60 in/min | A | 1 | 2 |
| 5 | Cu | In100 | 0.5 × 0.5 × 0.012 | 60 in/min | B | 2 | 2 |
| 6 | Cu | In100 | 0.5 × 0.5 × 0.012 | 60 in/min | B | 7 | 2 |
| 7 | Brass | In100 | 0.5 × 0.5 × 0.012 | 60 in/min | F | 6 | 2 |
| 8 | Cu | In100 | 0.5 × 0.5 × 0.012 | 60 in/min | F | 10 | 2 |
| 9 | Cu | In100 | 0.5 × 0.5 × 0.012 | 60 in/min | D | 8 | 2 |
| 10 | Brass | In100 | 0.5 × 0.5 × 0.012 | 60 in/min | D | 7 | 2 |
| 11 | Cu | Sn0.5/In99.5 | 0.5 × 0.5 × 0.012 | 50 in/min | B | 4 | 2 |
| 12 | Cu | Sn0.5/In99.5 | 0.5 × 0.5 × 0.012 | 50 in/min | E | 7 | 2 |
| 13 | Cu | Sn63/Pb37 | 0.6 × 0.6 × 0.012 | 30 in/min | C | 6 | 1 |
| 14 | Cu | Sn63/Pb37 | 0.6 × 0.6 × 0.012 | 30 in/min | D | 3 | 2 |
| 15 | Ni on Cu | In100 | 0.5 × 0.5 × 0.012 | 60 in/min | c | 6 | 2 |
| 16 | Ni on Cu | In100 | 0.5 × 0.5 × 0.012 | 60 in/min | B | 2 | 1 |
| 17 | Ni on Cu | In100 | 0.5 × 0.5 × 0.012 | 60 in/min | E | 7 | 1 |
| 18 | Ni on Cu | In100 | 0.5 × 0.5 × 0.012 | 60 in/min | F | 5 | 1 |
| 19 | Ni on Cu | In100 | 0.5 × 0.5 × 0.012 | 60 in/min | F | 5 | 2 |
| 20 | Ni on Cu | Sn0.5/In99.5 | 0.5 × 0.5 × 0.012 | 50 in/min | F | 5 | 2 |
| 21 | Ni on Cu | Sn0.5/In99.5 | 0.5 × 0.5 × 0.012 | 60 in/min | E | 8 | 1 |
| 22 | Ni on Cu | Sn0.5/In99.5 | 0.5 × 0.5 × 0.012 | 50 in/min | G | 10 | 1 |
| 23 | Ni on Cu | Sn63/Pb37 | 0.6 × 0.6 × 0.012 | 30 in/min | F | 5 | 2 |
| 24 | Ni on Cu | Sn63/Pb37 | 0.6 × 0.6 × 0.012 | 30 in/min | D | 3 | 2 |
| 25 | 304 Stainless | In100 | 0.5 × 0.5 × 0.012 | 50 in/min | F | 3 | 2 |
| 26 | 304 Stainless | Sn0.5/In99.5 | 0.5 × 0.5 × 0.012 | 50 in/min | G | 10 | 2 |
| 27 | 304 Stainless | Sn63/Pb37 | 0.6 × 0.6 × 0.012 | 30 in/min | F | 3 | 2 |
| 28 | 304 Stainless | Sn63/Pb37 | 0.6 × 0.6 × 0.012 | 30 in/min | H | 9 | 2 |

EXAMPLE 1

A droplet of Attaching Flux F, as described in Table III, of sufficient quantity to wet the surface of the solder preform, was added to a gold coated nickel/copper substrate. A solder preform of 100% indium with dimensions of 0.5 inch×0.5 inch×0.012 inch was then placed onto the flux, and pressed down with sufficient pressure to displace any excess flux from under the preform. This excess flux was removed by

EXAMPLE 3

A droplet of Attaching Flux B, as described in Table III, of sufficient quantity to wet the surface of the solder preform, was added to a brass substrate. A solder preform of 0.5% tin, 99.5% indium with dimensions of 0.5 inch×0.5 inch×0.012 inch was then placed onto the flux. The resulting assembly was then passed through the Sikama reflow oven, previously described, at 50 inches/minute. The Finishing Flux 2, as described in Table III, was added copiously by hand to the top of the preform, and around the sides of the preform, and reflowed again with the same conditions used previously. After the second reflow, the sample was rinsed with perchloroethylene and then dried with forced air. The resulting product was shiny and visually free of any residues.

EXAMPLE 4

To demonstrate that the combination of attaching flux and finishing flux can function for a one-step or two-step reflow process, a droplet of Attaching Flux A, as described in Table III, of sufficient quantity to wet the surface of the solder preform, was added to a copper substrate. A solder preform of 100% indium with dimensions of 0.5 inch×0.5 inch× 0.012 inch was then placed onto the flux. The Finishing Flux I, as described in Table III, was added with an Asymtek Century Series automatic dispensing system. The resulting assembly was then passed through the Sikama oven, previously described, at 60 inches/minute. After cooling, the sample was rinsed with perchloroethylene and then dried with forced air. The resulting product was shiny and visually free of any residues.

This example was continued by repeating the test except as a two-step reflow. A droplet of Attaching Flux A, as described in Table III, of sufficient quantity to wet the surface of the solder preform, was added to a copper substrate. A solder preform of 100% indium with dimensions of 0.5 inch×0.5 inch×0.012 inch was then placed onto the flux. The excess flux was removed by blotting with a paper towel. The resulting assembly was then passed through the Sikama reflow oven, previously described, at 60 inches/minute. The Finishing Flux 1, as described in Table III, was then added copiously by hand to the top of the preform, and around the sides of the preform, and reflowed again with the same conditions used previously. After the second reflow, the sample was rinsed with perchloroethylene and then dried with forced air. The resulting product was shiny and visually free of any residues.

EXAMPLE 5

A droplet of Attaching Flux B, as described in Table III, of sufficient quantity to wet the surface of the solder preform, was added to a copper substrate. A solder preform of 100% indium with dimensions of 0.5 inch×0.5 inch× 0.012 inch was then placed onto the flux. This excess flux was removed by blotting with a paper towel. The resulting assembly was then passed through the Sikama reflow oven, previously described, at 60 inches/minute. The Finishing Flux 2, as described in Table III, was then added copiously by hand to the top of the preform, and around the sides of the preform, and reflowed again with the same conditions used previously. After the second reflow, the sample was rinsed with perchloroethylene and then dried with forced air. The resulting product was shiny and visually free of any residues.

EXAMPLE 6

A droplet of Attaching Flux B, as described in Table III, of sufficient quantity to wet the surface of the solder preform, was added to a copper substrate (as in Example 5). A solder preform of 100% indium with dimensions of 0.5 inch×0.5 inch×0.012 inch was then placed onto the flux, and pressed down with sufficient pressure to displace any excess flux from under the preform. This excess flux was removed by blotting with a paper towel. The resulting assembly was then passed through the Sikama reflow oven, previously described, at 60 inches/minute. To avoid cleaning with perchloroethylene, the Finishing Flux 7, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 7

A droplet of Attaching Flux F, as described in Table III, of sufficient quantity to wet the surface of the solder preform, was added to a brass substrate. A solder preform of 100% indium with dimensions of 0.5 inch×0.5 inch×0.012 inch was then placed onto the flux. The resulting assembly was then passed through the Sikama reflow oven, previously described, at 60 inches/minute.

The Finishing Flux 6, as described in Table III, was added copiously by hand to the top of the preform, and around the sides of the preform, and reflowed again with the same conditions used previously. After the second reflow, the sample was rinsed with water, then isopropanol, and then dried with forced air. The resulting product, soldered with compatible organic fluxes, was shiny and visually free of any residues.

EXAMPLE 8

A droplet of Attaching Flux F (same as used in Example 7), as described in Table III, of sufficient quantity to wet the surface of the solder preform, was added to a copper substrate. A solder preform of 100% indium with dimensions of 0.5 inch×0.5 inch×0.012 inch was then placed onto the flux. The resulting assembly was then passed through the Sikama reflow oven, previously described, at 60 inches/ minute. The Finishing Flux 10, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 9

A droplet of Attaching Flux D, as described in Table III, of sufficient quantity to wet the surface of the solder preform, was added to a copper substrate. A solder preform of 100% indium with dimensions of 0.5 inch×0.5 inch× 0.012 inch was then placed onto the flux. The resulting assembly was then passed through the Sikama reflow oven, previously described, at 60 inches/minute. The Finishing Flux 8, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 10

A droplet of Attaching Flux D (same as used in Example 9), as described in Table III, of sufficient quantity to wet the surface of the solder preform, was added to a brass substrate. A solder preform of 100% indium with dimensions of 0.5 inch×0.5 inch×0.012 inch was then placed onto the flux. The resulting assembly was then passed through the Sikama reflow oven, previously described, at 60 inches/minute. The Finishing Flux 7, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 11

A droplet of Attaching Flux B, as described in Table III, of sufficient quantity to wet the surface of the solder preform, was added to a copper substrate. A solder preform of 0.5% tin, 99.5% indium with dimensions of 0.5 inch×0.5 inch×0.012 inch was then placed onto the flux. The resulting assembly was then passed through the Sikama reflow oven, previously described, at 50 inches/minute. The Finishing Flux 4, as described in Table III, was added copiously by hand to the top of the preform, and around the sides of the preform, and reflowed again with the same conditions used previously. After the second reflow, the sample was rinsed with perchloroethylene and then dried with forced air. The resulting product was shiny and visually free of any residues.

EXAMPLE 12

A droplet of Attaching Flux E, as described in Table III, of sufficient quantity to wet the surface of the solder preform, was added to a copper substrate. A solder preform of 0.5% tin, 99.5% indium with dimensions of 0.5 inch×0.5 inch×0.012 inch was then placed onto the flux. The resulting assembly was then passed through the Sikama reflow oven, previously described, at 50 inches/minute. The Finishing Flux 7, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 13

A droplet of Attaching Flux C, as described in Table III, of sufficient quantity to wet the surface of the solder preform, was added to a copper substrate. A solder preform of 63% tin, 37% lead with dimensions of 0.6 inch×0.6 inch×0.012 inch was then placed onto the flux. The Finishing Flux 6, as described in Table III, was added to the top of the preform, and around the sides of the preform with an Asymtek Century Series automatic dispensing system. The resulting assembly was then passed through the Sikama oven, previously described, at 30 inches/minute. After reflow, the sample was rinsed with water, then isopropanol, and then dried with forced air. The resulting product was shiny and visually free of any residues.

EXAMPLE 14

A droplet of Attaching Flux D, as described in Table III, of sufficient quantity to wet the surface of the solder preform, was added to a copper substrate. A solder preform of 63% tin, 37% lead with dimensions of 0.6 inch×0.6 inch×0.012 inch was then placed onto the flux. The resulting assembly was then passed through the Sikama reflow oven, previously described, at 30 inches/minute. The Finishing Flux 3, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 15

A droplet of Attaching Flux C, as described in Table III, of sufficient quantity to wet the surface of the solder preform, was added to a nickel plated copper substrate. A solder preform of 100% indium with dimensions of 0.5 inch×0.5 inch×0.012 inch was then placed onto the flux. The resulting assembly was then passed through the Sikama reflow oven, previously described, at 60 inches/minute. The Finishing Flux 6, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 16

A droplet of Attaching Flux B (same as originally used for Example 15), as described in Table III, of sufficient quantity to wet the surface of the solder preform, was added to a nickel plated copper substrate. A solder preform of 100% indium with dimensions of 0.5 inch×0.5 inch×0.012 inch was then placed onto the flux. The Finishing Flux 2, as described in Table III, was added to the top of the preform, and around the sides of the preform with an Asymtek Century Series automatic dispensing system. The resulting assembly was then passed through the Sikama oven, previously described, at 60 inches/minute. After reflow, the sample was rinsed with perchloroethylene and then dried with forced air. The resulting product was shiny and visually free of any residues.

EXAMPLE 17

A droplet of Attaching Flux E, as described in Table III, of sufficient quantity to wet the surface of the solder preform, was added to a nickel plated copper substrate. A solder preform of 100% indium with dimensions of 0.5 inch×0.5 inch×0.012 inch was then placed onto the flux. The Finishing Flux 7, as described in Table III, was added to the top of the preform, and around the sides of the preform with an Asymtek Century Series automatic dispensing system. The resulting assembly was then passed through the Sikama oven, previously described, at 60 inches/minute. After reflow, the sample was rinsed with water, then isopropanol, and then dried with forced air. The resulting product was shiny and visually free of any residues.

EXAMPLE 18

A droplet of Attaching Flux F, as described in Table III, of sufficient quantity to wet the surface of the solder preform, was added to a nickel plated copper substrate. A solder preform of 100% indium with dimensions of 0.5 inch×0.5 inch×0.012 inch was then placed onto the flux. The Finishing Flux 5, as described in Table III, was added to the top of the preform, and around the sides of the preform with an Asymtek Century Series automatic dispensing system. The resulting assembly was then passed through the Sikama oven, previously described, at 60 inches/minute. After reflow, the sample was rinsed with water, then isopropanol, and then dried with forced air. The resulting product was shiny and visually free of any residues.

EXAMPLE 19

A droplet of Attaching Flux F, as described in Table III, of sufficient quantity to wet the surface of the solder preform, was added to a nickel plated copper substrate. A solder preform of 100% indium with dimensions of 0.5 inch×0.5 inch×0.012 inch was then placed onto the flux, and pressed down with sufficient pressure to displace any excess flux from under the preform. This excess flux was removed by blotting with a paper towel. The resulting assembly was then passed through the Sikama reflow oven, previously described, at 60 inches/minute. The Finishing Flux 5, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 20

A droplet of Attaching Flux F, as described in Table III, of sufficient quantity to wet the surface of the solder preform, was added to a nickel plated copper substrate. A solder preform of 0.5% tin, 99.5% indium with dimensions of 0.5 inch×0.5 inch×0.012 inch was then placed onto the flux. The resulting assembly was then passed through the Sikama reflow oven, previously described, at 50 inches/minute. The Finishing Flux 5, as described in Table III, was added copiously by hand to the top of the preform, and around the sides of the preform, and reflowed again with the same conditions used previously. After the second reflow, the sample was rinsed with water, then isopropanol, and then dried with forded air. The resulting product was shiny and visually free of any residues.

EXAMPLE 21

A droplet of Attaching Flux E, as described in Table III, of sufficient quantity to wet the surface of the solder preform, was added to a nickel plated copper substrate. A solder preform of 0.5% tin, 99.5% indium with dimensions of 0.5 inch×0.5 inch×0.012 inch was then placed onto the flux. The resulting assembly was then passed through the Sikama reflow oven, previously described, at 60 inches/ minute.

The Finishing Flux 8, as described in Table III, was then added to the top of the preform with an Asymtek Century Series automatic dispensing system. The resulting assembly was then passed through the Sikama oven, previously described, at 60 inches/minute. After reflow, the sample was rinsed with water, then isopropanol, and then dried with forced air. The resulting product was shiny and visually free of any residues.

EXAMPLE 22

A droplet of Attaching Flux G, as described in Table III, of sufficient quantity to wet the surface of the solder preform, was added to a nickel plated copper substrate. A solder preform of 0.5% tin, 99.5% indium with dimensions of 0.5 inch×0.5 inch×0.012 inch was then placed onto the flux. The Finishing Flux 10, as described in Table III, was added to the top of the preform, and around the sides of the preform with an Asymtek Century Series automatic dispensing system. The resulting assembly was then passed through the Sikama oven, previously described, at 50 inches/minute. After reflow, the sample was rinsed with water, then isopropanol, and then dried with forced air. The resulting product was shiny and visually free of any residues.

EXAMPLE 23

A droplet of Attaching Flux F, as described in Table III, of sufficient quantity to wet the surface of the solder preform, was added to a nickel plated copper substrate. A solder preform of 63% tin, 37% lead with dimensions of 0.6 inch×0.6 inch×0.012 inch was then placed onto the flux. The resulting assembly was then passed through the Sikama reflow oven, previously described, at 30 inches/minute. The Finishing Flux 5, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 24

A droplet of Attaching Flux D, as described in Table III, of sufficient quantity to wet the surface of the solder preform, was added to a nickel plated copper substrate. A solder preform of 63% tin, 37% lead with dimensions of 0.6 inch×0.6 inch×0.012 inch was then placed onto the flux. The resulting assembly was then passed through the Sikama reflow oven, previously described, at 30 inches/minute. The Finishing Flux 3, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 25

A droplet of Attaching Flux F, as described in Table III, of sufficient quantity to wet the surface of the solder preform, was added to a 304 stainless steel substrate. A solder preform of 100% indium with dimensions of 0.5 inch×0.5 inch× 0.012 inch was then placed onto the flux. The resulting assembly was then passed through the Sikama reflow oven, previously described, at 50 inches/minute. The Finishing Flux 3, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 26

A droplet of Attaching Flux G, as described in Table III, of sufficient quantity to wet the surface of the solder preform, was added to a 304 stainless steel substrate. A solder preform of 0.5% tin, 99.5% indium with dimensions of 0.5 inch×0.5 inch×0.012 inch was then placed onto the flux. The resulting assembly was then passed through the Sikama reflow oven, previously described, at 50 inches/ minute. The Finishing Flux 10, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 27

A droplet of Attaching Flux F, as described in Table III, of sufficient quantity to wet the surface of the solder preform, was added to a 304 stainless steel substrate. A solder preform of 63% tin, 37% lead with dimensions of 0.6 inch×0.6 inch×0.012 inch was then placed onto the flux. The resulting assembly was then passed through the Sikama reflow oven, previously described, at 30 inches/minute. The Finishing Flux 3, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

EXAMPLE 28

A droplet of Attaching Flux H, as described in Table III, of sufficient quantity to wet the surface of the solder preform, was added to a 304 stainless steel substrate. A solder preform of 63% tin, 37% lead with dimensions of 0.6 inch×0.6 inch×0.012 inch was then placed onto the flux. The resulting assembly was then passed through the Sikama reflow oven, previously described, at 30 inches/minute. The Finishing Flux 9, as described in Table III, was added copiously by hand to the top of the preform, and around the sides of the preform, and reflowed again with the same conditions used previously. After the second reflow, the sample was rinsed with water, then isopropanol, and then dried with forced air. The resulting product was shiny and visually free of any residues.

While the present invention has been particularly described, in conjunction with the specific preferred embodiment, it is evident that many alternatives, modifications, and variations will be apparent to those skilled in the art in light of the foregoing description. It is therefore contemplated that the appended claims will embrace any such alternatives, modifications, and variations as falling within the truth, scope, and spirit of the present invention.

We claim:

1. A method of controlling solder deposition on base metal utilizing two fluxes and preformed solder comprising:
    a) applying an effective amount of an attaching flux to a base metal or substrate wherein the attaching flux may cause the formation of harmful, insoluble, or corrosive residues on the base metal or substrate if it is allowed to remain on the base metal or substrate after being subjected to heated reflow conditions,
    b) placing a preform on the substrate containing an effective amount of the attaching flux,
    c) applying an effective amount on a finishing flux onto the preform that can effectively solubilize harmful, insoluble or corrosive residues that may remain on the base metal or substrate after being subjected to heated reflow conditions,
    d) subjecting the substrate, flux and preform to heated reflow conditions, to form a solder deposit,
    e) drying the cleaned substrate and solder deposit.

2. The method of claim 1 wherein the amount of attaching flux is sufficient to fill a capillary space between the preform and substrate.

3. The method of claim 1 wherein the attaching flux is rosin mildly activated type.

4. The method of claim 1 wherein the attaching flux is rosin highly activated type.

5. The method of claim 1 wherein the attaching flux is an organic acid type.

6. The method of claim 1 wherein the attaching flux is an inorganic acid type.

7. The method of claim 1 wherein the preform is placed on the substrate with sufficient force to have it contact the attaching flux on the substrate.

8. The method of claim 1 wherein the finishing flux is selected from the group consisting of rosin, rosin mildly activated, rosin activated, organic and inorganic acid fluxes.

9. The method of claim 1 wherein the amount of finishing flux is sufficient to solubilize salts of the attaching fluxes after reflow.

10. The method of claim 1 wherein the reflow conditions cause the solder preform to be liquidus and to wet the substrate.

11. The method of claim 10 wherein the reflow conditions comprise heating the preform and substrate at about 20 to about 40° C. above the liquidus of the solder.

12. The method of claim 1 wherein the substrate and solder deposit are cleaned by washing with suitable solvents.

13. The method of claim 1 wherein the substrate and solder deposit are cleaned by solvents selected from the group consisting of polar solvents and non-polar solvents.

14. The method of claim 3 wherein the substrate is selected from the group consisting of platinum, gold, copper, tin, solder, palladium and silver.

15. The method of claim 14 wherein the substrate is copper.

16. The method of claim 14 wherein the substrate surface is plated with a second metal.

17. The method of claim 4 wherein the substrate is selected from the group consisting of nickel, cadmium, brass, lead, bronze, rhodium, copper, and beryllium-copper.

18. The method of claim 17 wherein the substrate is copper.

19. The method of claim 17 wherein the substrate is nickel.

20. The method of claim 17 wherein the substrate is plated with a second metal.

21. The method of claim 5 wherein the substrate is selected from the group consisting of nickel-iron, nickel-iron-cobalt, copper and nickel.

22. The method of claim 21 wherein the substrate is plated with a second metal.

23. The method of claim 21 wherein the substrate is copper.

24. The method of claim 21 wherein the substrate is nickel.

25. The method of claim 6 wherein the substrate is selected from the group consisting of copper, nickel, zinc, mild steel, stainless steel, nickel-chrome, nickel-copper and aluminum.

26. The method of claim 25 wherein the substrate is copper.

27. The method of claim 25 wherein the substrate is nickel.

28. The method of claim 25 wherein the substrate is stainless steel.

29. The method of claim 25 wherein the substrate is mild steel.

30. The method of claim 25 wherein the substrate is plated with a second metal.

31. The method of claim 1 wherein the solder deposit is free of voids.

32. The method of controlling solder deposition on a base metal utilizing dual fluxes and preformed solder comprising:
   a) applying an effective amount of an attaching flux to a base metal or substrate wherein the attaching flux may cause the formation of harmful, insoluble, or corrosive residues on the base metal or substrate if it is allowed to remain on the base metal or substrate after being subjected to heated reflow conditions,
   b) placing a preform on the substrate containing an effective amount of the attaching flux,
   c) subjecting the substrate, flux and preform to heated reflow conditions, forming a solder deposit,
   d) applying an effective amount of a finishing flux to the solder deposit to solubilize residues left by the attaching flux,
   e) subjecting the substrate, finishing flux and solder deposit to heated reflow conditions,
   f) cleaning the substrate and solder deposit, and
   g) drying the cleaned substrate and solder deposit.

33. The method of claim 32 wherein the amount of attaching flux is sufficient to fill a capillary space between the preform and substrate.

34. The method of claim 32 wherein the attaching flux is rosin mildly activated type.

35. The method of claim 32 wherein the attaching flux is rosin highly activated type.

36. The method of claim 32 wherein the attaching flux is an organic acid type.

37. The method of claim 32 wherein the attaching flux is an inorganic acid type.

38. The method of claim 32 wherein the substrate is selected from the group consisting of platinum, gold, copper, tin, solder, palladium and silver.

39. The method of claim 38 wherein the substrate is copper.

40. The method of claim 38 wherein the substrate is plated with a second metal.

41. The method of claim 35 wherein the substrate is selected from the group consisting of nickel, copper, cadmium, brass, lead, bronze, rhodium, beryllium-copper.

42. The method of claim 41 wherein the substrate is copper.

43. The method of claim 41 wherein the substrate is nickel.

44. The method of claim 41 wherein the substrate is plated with a second metal.

45. The method of claim 41 wherein the substrate is selected from the group consisting of nickel-iron, nickel-iron-cobalt, copper and nickel.

46. The method of claim 45 wherein the substrate is plated with a second metal.

47. The method of claim 45 wherein the substrate is copper.

48. The method of claim 45 wherein the substrate is nickel.

49. The method of claim 37 wherein the substrate is selected from the group consisting of copper, nickel, zinc, mild steel, stainless steel, nickel-chrome, nickel-copper and aluminum.

50. The method of claim 49 wherein the substrate is copper.

51. The method of claim 49 wherein the substrate is nickel.

52. The method of claim 49 wherein the substrate is stainless steel.

53. The method of claim 49 wherein the substrate is mild steel.

54. The method of claim 49 wherein the substrate is plated with a second metal.

55. The method of claim 32 wherein the reflow conditions cause the solder preform to be liquidus and to wet the substrate.

56. The method of claim 32 wherein the reflow conditions comprise heating the preform and substrate at about 20–40° C., above the liquidus of the solder.

57. The method of claim 32 wherein the substrate and solder deposit are cleaned by washing with suitable solvents.

58. The method of claim 32 wherein the substrate and solder deposit are cleaned by solvents selected from the group consisting of polar solvents and non-polar solvents.

59. The method of claim 32 wherein the finishing flux is selected from the group consisting of rosin, rosin mildly activated, rosin activated, organic and inorganic fluxes.

60. The method of claim 32 wherein the solder deposit is free of voids.

* * * * *